United States Patent
Roesner et al.

[11] Patent Number: 5,583,819
[45] Date of Patent: Dec. 10, 1996

[54] APPARATUS AND METHOD OF USE OF RADIOFREQUENCY IDENTIFICATION TAGS

[75] Inventors: Bruce B. Roesner, Poway, Calif.; Ronald M. Ames, Aurora, Colo.

[73] Assignee: Single Chip Holdings, Inc., San Diego, Calif.

[21] Appl. No.: 379,923

[22] Filed: Jan. 27, 1995

[51] Int. Cl.[6] ................................ G11C 17/16
[52] U.S. Cl. .................. 365/225.7; 365/96; 327/525; 235/380; 340/825.34
[58] Field of Search .................... 365/96, 225.7; 327/525; 340/825.34; 235/492, 380

[56] References Cited

U.S. PATENT DOCUMENTS

| | | | |
|---|---|---|---|
| 4,442,507 | 4/1984 | Roesner | 365/100 |
| 4,796,074 | 3/1989 | Roesner | 257/476 |
| 5,008,855 | 4/1991 | Eltoukhy et al. | 365/225.7 |
| 5,095,362 | 1/1992 | Roesner | 257/330 |
| 5,243,226 | 9/1993 | Chan | 365/96 |
| 5,257,222 | 10/1993 | Lee | 365/225.7 |
| 5,301,159 | 4/1994 | Lee | 365/225.7 |
| 5,367,207 | 11/1994 | Goetting et al. | 327/525 |
| 5,371,414 | 12/1994 | Galbraith | 365/96 |
| 5,448,187 | 9/1995 | Kowalski | 365/225.7 |
| 5,469,109 | 11/1995 | Paivinen | 327/525 |
| 5,471,154 | 11/1995 | Gordon et al. | 327/525 |
| 5,495,436 | 2/1996 | Callahan | 365/225.7 |
| 5,502,395 | 3/1996 | Allen | 327/525 |

*Primary Examiner*—Tan T. Nguyen
*Attorney, Agent, or Firm*—Daniel L. Dawes

[57] ABSTRACT

A method of programming or writing to an RFID tag with a transient pulse at both high and low frequencies, i.e. in the GHz and KHz ranges is described. Programming an RFID tag using transient pulses rather than a long duration regulated signal allows for less control circuitry, less programming time, less energy, less cost and power requirements for the RFID tag.

6 Claims, 5 Drawing Sheets

APPARATUS AND METHOD OF USE OF RADIOFREQUENCY IDENTIFICATION TAGS

BACKGROUND OF THE INVENTION

1. Field of the Invention

The invention relates to radiofrequency identification devices used to tag or identify objects, and in particular to radiofrequency identification devices that may be transiently programmed, remotely self-calibrated for synchronization, remotely powered during data communication, and implemented using a high frequency isolated monolithic rectifier.

2. Description of the Prior Art

Low Power Antifuse RFID Memory

A radiofrequency identification device or tag (hereinafter referred to throughout this specification as an "RFID tag") is a device which can be attached or associated with another object, which the RFID tag is then used to identify when queried remotely by an interrogating circuit. The RFID tag is thus preprogrammed, or programmable after association with the object to return a signal to the interrogating circuit to provide selected information concerning the attached object which is within the zone of the interrogating circuit. More simply, a small electronic tag is attached to an object and the tag is read by a reader. New data can be added to the tag by a programmer, and the data received from the tag can either be read from a display screen, stored or later downloaded to a personal computer, or linked directly to a computer system.

RFID tags have an advantage over bar codes and bar code readers which perform similar functions in that the RFID tag may be imbedded within the object and still be read as long as the interlying material between the RFID tag and the reader is not conductive. Therefore, line of sight is not required for an RFID tag, which is required in any type of bar code reader. This allows the RFID tag to function in very difficult environments. Further, the RFID tag has the capacity for having digital data being added after it is attached to the object, has a greater data capacity and can be read at distances far greater than those achievable through optical bar code readers.

To date, the cost of RFID tags, however, has limited the market penetration of the device because of the high cost associated with such RFID tags.

Ishihara et al., "*Antifuse Memory Device with Switched Capacitor Setting Method,*" U.S. Pat. No. 5,299,152 (1994) describes a capacitively charged pump circuit in which signals are applied to gates to charge pump a capacitive element for the purposes of subjecting an antifuse coupled to the capacitor to dielectric breakdown for programming purposes. The charge pump is certainly not transient and required considerable power, making both the circuitry and methodology impractical for most RFID tags.

Therefore, what is needed is an RFID tag which can be manufactured at low cost, programmed and run at low energies, programmed in the field, and still retain each of the advantages of RFID tags over the bar codes as discussed above.

Self-Calibration of Timing for an RFID Tag

A persistent problem with low power RFID tags is the remote calibration of the circuit to allow information sent to the RFID tag to be decoded accurately. If the clock signals or discrimination levels are not properly calibrated on the RFID tag properly, or if such calibration is not maintained as environmental circumstances of the tag changes, then transfer of information to and from the tag becomes unreliable. First consider some prior art self-calibration schemes used in other applications.

Goffin, II, "*Method and Apparatus for a Calibrated Electronic Timing Circuit,*" U.S. Pat. No. 5,117,756 (1992), adjusts an internal oscillator by comparing its output to a control signal. A precision calibration pulse is applied to the timing circuit which counts the output cycles of a variable frequency oscillator during the period of the pulse. This count is stored and compared to the reference count to produce an error count. The error count is combined with a previously stored control signal to produce a new control signal that drives the output of the oscillator to a new frequency.

Goffin's calibration circuit is used for a calibrated time delay circuit for delayed ignition of explosive products. The application is to minimize the effects of rock blasting on nearby structures by reducing peak-to-peak amplitude of frequency of ground vibration produced by the blast by timing the ignition of the plurality of explosive charges. Goffin achieves this with an onboard calibration pulse derived from a time reference and then calibrates the detonation timing circuitry to it in order to compensate for fluctuations, ambient temperature, humidity and pressure that may cause a variation in the local oscillator rate. Goffin is not concerned with a remote communication circuit, but rather with calibration of a plurality of detonator circuits with each other, all connected by hard wiring.

Weaver, "*Electronic Frequency Control for Radio Receivers,*" U.S. Pat. No. 2,501,883 (1950), also generally describes a circuit which adjusts an internal oscillator by comparing its output to a control signal. Weaver's object is to provide a local beat frequency and proper frequency relationship to a carrier. In particular, Weaver seeks to keep a local oscillator adjusted to generate a wave having substantially the same frequency relationship to the received carrier as existed before a carrier fade commenced. Weaver achieves this by combining a wave derived from the received carrier with a locally generated reference wave to produce a controlling voltage whose magnitude and polarity are determined by the vector sum or difference of the combined waves. A reactance tube is connected to control the frequency generated by the oscillator. The grid of the reactance tube is coupled to two biasing circuits, which are in turn driven by the controlling voltage.

Information transmitted to an RFID tag is decoded either by detecting the variation in the amplitude (AM) or frequency or equivalently the phase shift or time delay (FM) of the carrier signal, depending upon the communication protocol which has been chosen as the standard. Changes in the amplitude of the carrier signal are economically detected by conventional RFID tag receivers, but are susceptible to noise interference. In the transmission of digital information, the loss of just a single bit of data can, if inappropriate, cause catastrophic consequences.

Detection of a change of frequency is less susceptible to noise interference but requires that the RFID tag receiver be capable of detecting changes in the carrier signal as against a calibrated standard. RFID tag receivers typically rely on some type of internally tuned circuit to compare the incoming signal to the standard in order to detect the frequency variation. However, if the RFID tag receiver is depended upon the incoming carrier signal as a reference itself, as is almost always the case with RFID tags, it is inherently impossible to detect changes in the incoming signal using standard FM techniques.

Therefore, what is needed is a method whereby a remote RFID tag circuit can calibrate itself with respect to an input signal allowing for information to be decoded after the completion of the calibration, which decoding would not have been possible before calibration.

Bit and Frame Synchronization

It is further well known that in every communication protocol some means is required to determine which bit is the first data bit in a digital data transmission. This determination process becomes more difficult in wireless devices. Since the transmitting device may be at the extreme end of an operating range, noise and signal dropout make reliable detection of digital data difficult, as well as validation of synchronization at both the bit and data frame levels.

Wireless devices typically move into and out of range quickly. Therefore, it is an advantage if the bit synchronization is achieved in a minimum of time so that the wireless device can start looking for the frame synchronization as soon as possible. Typically, the ability of the wireless device to do this makes a critical difference in whether the communication is successful or not.

In some RFID tags a violation of the "normal" data protocol is used to identify the beginning of a data frame. Milheiser, U.S. Pat. No. 4,730,188 teaches that using Manchester encoding defines a protocol that has a change of state every bit time. The data frame includes a frame marker which contains a preamble with a specific bit pattern followed by a violation of the Manchester bit timing protocol in which the rate of change of state is decreased to 1½ bit times for 3 bit intervals, followed by the identification of the data in which the bit rate is restored. This type of bit synchronization is usable in Milheiser's application where the tag transmits to a reader, but the RFID tag does not receive coded data.

Even in Milheiser's application, some disadvantages exist. Since Milheiser must first achieve bit synchronization, the use of phase lock loop is necessary, which uses feedback of a received frequency transition to adjust a rate to become synchronized. If the protocol violation occurs at that moment in time, the phase lock loop will attempt to synchronize to a rate ⅓ lower. The result is that the bit synchronization is delayed in a frame which could have been read but is not.

The prior art has also devised an alternative approach which is not subject to the disadvantages of the Milheiser protocol. According to this alternative approach, a unique data value is assigned as a frame marker, which unique value is then prohibited from being used as a data pattern. This approach allows for all or any part of the data frame to be used for a bit synchronization. The unique data pattern must not be a pattern which the user would ever want to use in the data since it is prohibited to prevent ambiguity. If the unique data pattern is required, an alias is created which is then translated back to the prohibited value at a later time. This alias creation and retranslation is an awkward solution in most applications.

This approach also leads the user to choose a value such as all 1's or all 0's for the unique pattern. Such a pattern is not a practical choice since the memory in most application devices is normally initialized to either all 1's or 0's in any case.

Lee, "*Fault and Error Detection Arrangement*," U.S. Pat. No. 4,429,391 (1984), describes a fault and error detection arrangement for detecting transmitting and routing errors made in a central data transmitter and receiver communicating with peripheral circuits in which parity bits of certain data words are transmitted by the central data transmitter after being intentionally inverted by central parity inverter in a known sequence. The purpose of the inversion every predetermined number of frame is used for synchronization. In particular, the central parity inverter inverts the parity bit every ninth data word in response to parity control signals transmitted by the sequence generator.

Thus, Lee looks for repetitive parity violation on a periodic basis in order to establish timing. The drawback, however, is in cases where there is signal fade which is common with RFID tag devices, an insufficient number of synchronization parity violations may have been received in order to reliably establish the pattern, or that the pattern may be unreliably transmitted thereby leading to substantial errors in synchronization.

Terrab et al., "*Method and Apparatus for Ensuring CRC Error Generation by a Data Communication Station Experiencing Transmitter Exceptions*," U.S. Pat. No. 5,195,093 (1993), shows a unique code generation scheme using parity change. Each byte of serial bit stream is sequentially transmitted. If a transmitter exception occurs, the byte before the exception is transmitted normally. However, only the first seven bits of the last byte are transmitted. The parity bit is sent as an eighth bit of the last byte ensuring odd parity for the previous bit stream. Thereafter, a byte even parity is sent to ensure the overall message has odd parity. A receiving station interprets two consecutive bytes having the predetermined data pattern as the CRC, thus assuring that the receiving station will reject the frame.

Therefore, what is needed is some type of method for achieving bit and frame synchronization in digital signals transmitted between radiofrequency identification tags and readers or writers in a way which is very simple and yet efficient to implement in an integrated circuit.

Data Communication and Power

Typically RFID systems transmit a carrier signal and then divide down the carrier frequency on the tag to use the signal as an internal clock. The information stored on the tag is then sequentially transmitted from the tag. A tag which operates in this manner is a read-only tag. The information in the tag must be entered during the manufacturing of the tag by making direct electrical contact to external connectors, or by having a battery or charged capacitor physically connected to the tag.

There is a recognized need to be able to add information into the RFID tag remotely in the field rather than having information loaded into the tag only during its manufacture. Remote programming or wireless programming without any physical contact to the tag being made can only be accomplished if power and information are both supplied simultaneously to the tag. Programming the tag requires substantially more power than simply reading the tag. Prior art methods for remote programming rely on AM modulating the signal or FM modulating the frequency to communicate with the tag. Again AM is susceptible to interference through noise and FM requires significant sensing or detection circuitry to be built within the tag.

Consider first how the prior art has transmitted data and power on carrier signals. Kobayashi et al., "*Digitally Remote Control Transmission Apparatus*," U.S. Pat. No. 4,914,428 (1990), describes the use of a time duration alteration between synchronization signals. The transmitted coded digital instruction is composed of a sequence of synchronization pulses having a predetermined period and data pulses which are inserted between the successive synchronization pulses at predetermined positions dependent upon whether data pulses represent a 0 or 1 bit. The receiving circuit distinguishes between the 0 and 1 bits by detecting the length of the interval between the leading edge of a synchronization pulse and the leading edge of an adjacent data pulse and determines the existence of noise, if more than one data pulse is detected between successive synchronization pulses. The length of each data word which is sent is constant regardless of the numbers of 1's and 0's in the word so that the detection of more than one data pulse between successive synchronization pulses of a constant period is interpreted as being noise. Kobayashi thus uses pulse delay in order to distinguish between binary 0's and 1's from a periodic timing pulse.

Stobbe et al., "*Portable Field-Programmable Detection Microchip,*" U.S. Pat. No. 5,218,343 (1993), shows a system for transmitting both power and information to a remote circuit using external charging capacitors, an internal oscillator, an AM signal from the chip, and a period variation to distinguish between binary 0's and 1's. The RFID tag chip in Stobbe is provided with a charging capacitor capable of storing electrical energy from the RF signal so that the microchip in the tag can be powered during pulse pauses of the RF signal. The microchip includes a memory circuit for storing the identification code of the microchip in a code generator that is coupled to the memory circuit for generating an RF signal that is modulated with the identification data. A switching element detunes a resonant circuit in the microchip when the identification data is transmitted back to the read/write device. The resonant circuit serves to field program the memory circuit of the microchip and the tag by receiving pulse/pause modulation signals (PPM) of the RF carrier signal to allow the identification code of the tag to be altered. Stobbe describes a mixing of commands and data by AM modulation.

Kriofsky et al., "*Inductively Coupled Transmitter-Responder Arrangement,*" U.S. Pat. No. 3,859,624 (1975), describes a conventional low frequency RFID tag which is powered through inductive coupling so that the tag generates uniquely coded information sent back to a reader. The coded information is not however transmitted as part of or modulation of the inductive power signal.

Therefore what is needed is a method for delivering energy remotely to an RFID tag while at the same time transmitting information to the tag. Some means must be found whereby the carrier signal broadcasts to the tag can both deliver data which is sensed and power at the same time.

Rectifiers for RFID Tags

In current designs for RFID tags, the carrier signals are rectified through the use of on-chip transistors which are typically slow, there being no need for fast response times. A conventional full wave bridge rectifier using 4 diodes as depicted in FIG. 9 is typically not used in an RFID tag because the parasitic junctions formed in a conventional monolithic integrated circuit, by which such a diode bridge would be made, cause the structure to be inoperable in the application of an RFID tag.

Figure 9:
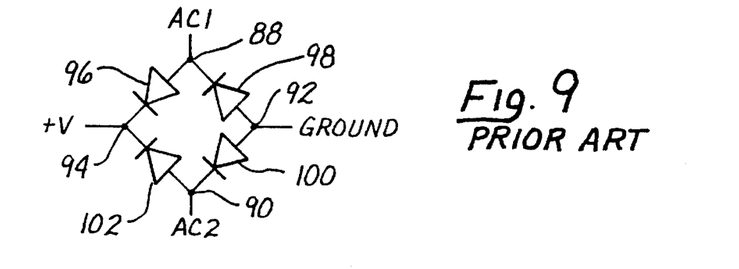
FIG. 9 is a schematic of a conventional full wave bridge rectifier.
Figure 10:
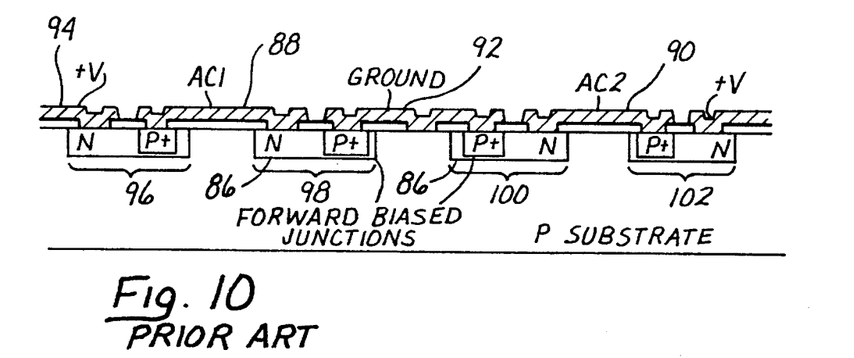
FIG. 10 is a cross-sectional view of a conventional integrated circuit wherein the bridge circuit of FIG. 9 is implemented.

FIG. 10 is a cross section of a typical integrated circuit layout for a rectifier bridge as shown in FIG. 9. Junctions 86 in the circuitry of FIG. 10 become forward biased when applying an AC signal on contacts 88 and 90 corresponding to the same junctions referenced in the schematic of FIG. 9.

Trying to implement a transistor structure in a high frequency range such as 915 Megahertz or 2.5 Gigahertz in an RFID tag leads to even further difficulties. First, MOS transistors must be scaled in order to operate at such speeds or a high speed bipolar device such as using a biCMOS process. Both types of transistor technology require a much higher cost to manufacture and the parasitic capacitance in such devices have a substantially greater effect as the frequency of operation is increased.

Therefore, what is needed is a method of rectifying a carrier signal transmitted to an RFID tag for the purposes of powering the tag which is not subject to the defects of the prior art.

BRIEF SUMMARY OF THE INVENTION

The invention is a method of programming a radiofrequency identification device comprising providing an antifuse in a memory cell coupled to a bit line in the radiofrequency identification device. A stray capacitance on the bit line is charged. The stray capacitance is selectively discharged through the antifuse to draw a high peak current from the charged stray capacitance to program the antifuse. As a result, the antifuse is programmed at high speed and low power.

Charging the stray capacitance comprises charging the capacitance to a voltage exceeding the antifuse programming voltage. Typically charging the stray capacitance on the bit line charges the capacitance with approximately 60 to 100 microwatts of power or less.

The selective discharging of the antifuse is performed in one embodiment by coupling the antifuse through a gated transistor to ground. The gated transistor has a maximum saturation current capacity. The antifuse has a programming time defined for a predetermined time duration. The stray capacitance on the bit line is charged to a power level such that the saturation current is achieved through the antifuse and transistor during the programming time of the antifuse.

Restated in another way the invention is a method of programming an antifuse having a minimum programming time at high speed and low power comprising charging a bit line coupled to the antifuse to a predetermined voltage and thus stored predetermined power level. The bit line has a chargeable capacitance. The bit line is discharged through the antifuse at high speed substantially equal to the minimum programming time required by the antifuse to generate a voltage and current spike through the antifuse sufficient to program the antifuse while utilizing low average power.

The invention is also a method for self-calibrating remote RFID tag circuitry comprising receiving an external signal having a characterizing parameter and receiving an internal signal having the characterizing parameter. The characterizing parameters of the external and internal signals are compared. An error signal indicative of the difference in the characterizing parameters in the compared external and internal signals is generated. A correction signal is generated which when applied to the remote circuit compensates the internal signal to allow for calibration to the external signal. As a result, the remote RFID tag circuit is calibrated with respect to the external signal for reliable and low cost communication therewith.

Generating the correction signal comprises generating an oscillator correction signal to adjust the internal signal to within a predetermined tolerance of the external signal.

In an alternative embodiment generating the compensation signal comprises generating a correction factor for use in operation of the remote RFID tag circuit where the error in the characteristic parameter between the external and internal signals remains substantially constant during times of operational interest of the remote RFID tag circuit.

The invention includes a method wherein operational characteristics of the remote RFID tag circuit change over time periods greater than those time periods of operational interest of the remote RFID tag circuit. The method further comprises repeating the steps of receiving the external/ internal signals, comparing the characteristic parameters, generating an error signal and generating a correction signal to update the compensation signal as the error signal changes slowly over time.

In one particular embodiment generating the correction signal comprises generating a signal to select a compensating RC time constant to be coupled to the oscillator.

The invention is also defined as an apparatus for self-calibrating a remote RFID tag circuit comprising a comparator coupled to an external signal and an internal signal which is to be calibrated with respect to the external signal. The comparator generates an error signal indicative of the difference in a characteristic parameter of the external and internal signals. A processing circuit is coupled to the comparator and is responsive to the error signal to generate a compensation signal which when applied to the remote RFID tag circuit allows for calibration of the internal signal from the remote RFID tag circuit to be calibrated to the external signal received by the remote circuit. As a result, the remote RFID tag circuit is provided with reliable economic calibration for communication.

Thus it is understood that in one embodiment the apparatus further comprises a memory coupled to the processing circuit for storing the compensation signal to maintain calibration of the remote RFID tag circuit.

The apparatus further comprises a oscillator in the remote circuit for generating the internal signal and an RC network having a plurality of selectable RC values. The compensation signal from the processing circuit selects one of the RC values for coupling to the oscillator in order to maintain a characteristic parameter of the internal signal calibrated within a predetermined tolerance to the external signal.

In another embodiment the compensation signal generated by the processing circuit is a correction factor indicative of the error between the internal and external signals. The correction factor is applied by the processing circuit to operations within the remote RFID tag circuit for maintaining reliable calibration to the external signal. In particular the correction signal is proportional to the ratio between the characteristic parameter for the external signal and the internal signal.

The invention is further defined as a method for providing data communication synchronization comprising checking a communication data stream having a predetermined error correction protocol for an unique data bit pattern, and determining whether the unique data pattern also violates the error checking protocol. The timing of the unique data pattern is used as a synchronization signal if the error checking protocol is violated. As a result, bit and frame synchronization is achieved anywhere within the data bit stream. The unique pattern is a unique pattern which is typical of data normally received. In the illustrated embodiment determining whether an error correction violation has occurred is a determination of whether a parity error violation has occurred.

More specifically the data stream is organized into words and the unique data pattern comprises at least one word subject to the error correction protocol. The word has a bit length at least equal to a predetermined minimum so that the probability of creating in a normal data stream the unique pattern with error correction violation is less than a predetermined acceptable minimum.

The invention is an apparatus for providing a synchronization marker comprising an error correction circuit for receiving a data signal stream. A decoder checks the data signal stream for a unique pattern and simultaneous parity error violation. The decoder is coupled to the error correction circuit and disables the error correction output in the event of simultaneous detection of the unique data pattern and error correction violation to generate a synchronization signal. The error correction circuit is a parity checker.

The invention is a method of simultaneously powering and communicating data to a wireless remote RFID tag circuit comprising transmitting a carrier signal to the circuit for providing power to the circuit. The carrier signal is modulated to reduced levels using pulse widths equal to or less than a predetermined maximum. The predetermined maximum is determined by the longest duration for which the carrier signal may be turned off before the remote RFID tag circuit loses stored power to a degree sufficient to make operation of the remote RFID tag circuit unreliable.

The carrier signal is modulated by pulses having at least two distinguishable pulse widths. The pulse widths are correlated with transmitted information to the remote RFID tag circuit. In another embodiment the carrier signal is modulated by at least three pulses of different pulse widths to communicate binary data and control signals. The modulation is at a frequency substantially less than the carrier signal so that the remote circuit is operated at the reduced frequency at lower power. For example, the carrier signal is modulated with a duty cycle at or less than a predetermined maximum as determined by the minimum duty cycle by which the remote RFID tag circuit will still reliably operate.

The invention is further an improvement in a diode rectifier having a plurality of diodes in an RFID tag comprising an insulating material disposed beneath and between each the diode in the rectifier to electrically isolate each diode from each other diode within the rectifier to prevent forward biasing of any of the diode junctions at high frequencies.

In one embodiment the insulating layer comprises an insulating substrate upon which the diode is formed. For example, the substrate is sapphire and the diode is formed by a silicon-on-sapphire process. In another embodiment the insulating layer is a silicon substrate surface of an integrated circuit having an overlying oxide layer, and the diode is a stacked diode disposed on the oxide layer. The stacked diode is preferably a Schottky diode operable at high frequency carrier signals at which the RFID tag is operated.

The invention may be better visualized by now turning to the following drawings wherein like elements are references by like numerals.

The invention may now be better understood by turning to the following detailed description.

DETAILED DESCRIPTION OF THE PREFERRED EMBODIMENTS

Low Power Antifuse RFID Memory

First consider a method of programming or writing to an RFID tag with a transient pulse at both high and low frequencies, i.e. in the GHz and KHz ranges. As will become clear below, programming an RFID tag using transient pulses rather than a long duration regulated signal allows for less control circuitry, less programming time, less energy, less cost and power requirements for the RFID tag.

In the prior art, programming of RFID tags was typically implemented through optically (ultraviolet) and electrically erasable programmable technologies that require a voltage or current pulse of a certain value for a specified period to be applied to the RFID tag. For example, an optically erasable device must have a minimum of 10 volts applied to the device while supplying a current of the order of 0.5 milliamps for at least 1 millisecond. In electrically erasable memories, the voltage requirement is typically a minimum of 15 volts for at least 1 millisecond, although current requirements may reach as low as 100 microamps.

The advantages of the invention are realized by utilizing an electrically programmable element which requires very little energy to program. Such an element is an antifuse such as described in U.S. Pat. Nos. 4,442,507; 4,796,074; and 5,095,362 which are incorporated herein by reference. The voltage on the stray nodal discharge capacitance in the antifuse device is exploited to provide sufficient energy to program the antifuse structure.

Figure 1:
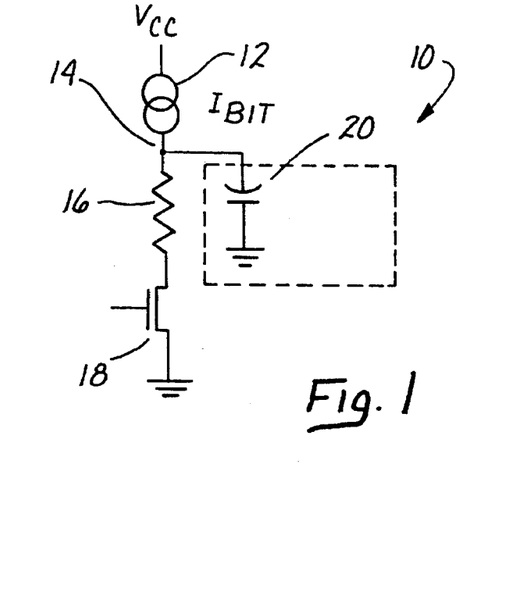
FIG. 1 is an idealized schematic of a memory cell in which an antifuse is used and programmed in an RFID tag.

Consider the idealized schematic diagram of FIG. 1, showing an antifuse memory element, generally denoted by reference numeral 10. Element 10 is comprised of a current source 12 of some type operating at a voltage of Vcc. Current source 12 is then coupled through a bit line 14 to an antifuse 16. A semiconductor transistor 18 is coupled to antifuse 16 and can be selectively activated to read whether antifuse 16 is in a high or low impedance state, thereby representing a 1 or 0 bit. The nodal capacitance of circuit 10 with bit line 14 is represented in the diagram of FIG. 1 by an effective stray capacitance 20. In normal operation, memory cell 10 is accessed by turning control transistor 18 on by increasing its gate voltage and detecting if current is flowing through bit line 14. If antifuse 16 has not been programmed, and is therefore open circuited or at high impedance, almost no current will flow. If antifuse 16 has been programmed or short circuited or set at very low impedance, a predetermined amount of current will flow through bit line 14.

To program the bit in cell 10, bit line 14 is raised to an elevated voltage above the critical voltage required to program antifuse element 16. A finite amount of time is required to fully elevate bit line 14 because of the requirement to charge stray capacitance 20. This charging time is a function of the amount of current being supplied to bit line 14 and amount of stray capacitance 20 associated with bit line 14. By allowing bit line 14 to reach its stable DC level of operation before turning on control transistor 18, control transistor 18 can set the upper limit of current through antifuse 16, as opposed to being restricted or set by the capacity of current source 12.

For example, assume for the sake of illustration, that antifuse 16 has a programming level of 4 volts. Assume further that Vcc, the voltage supply, is set to 6 volts. Assume that the maximum current level through control transistor 18 is 1 milliamp, stray capacitance 20 is 3 picofarads and that current source 12 is capable of supplying up to 10 microamps. By Ohm's law in differential form when current source 12 is turned on, bit line 14 will require 1.8 microseconds to reach the 6 volt level under these assumptions. At any time after this 1.8 microsecond time period, control transistor 18 can be turned on and antifuse 16 will try to support the 6 volts applied to it through the voltage supply. However, the voltage across antifuse 16 will, in fact, only reach 4 volts before it collapses. The time required to program antifuse 16 is, therefore, practically instantaneous, or at least much less than 10 nanoseconds.

Under the assumptions of this example, a potential current level of 1.2 milliamps could be reached within antifuse 16. However, control transistor 18 in the proposed example is assumed to limit the current to 1.0 milliamp. Even more important is the time averaged power requirements as is better illustrated in the timing diagram of FIG. 2. Lines 24 and 26 represent the current and voltage on bit line 14 characteristic of a classic charging node. The voltage on control transistor 18 is depicted by curve 28 and goes active at time 30. The voltage and current on antifuse 16 are denoted by lines 32 and 22. Note that the peak current through antifuse 16, as shown on line 22, is quite high, but of very short duration. The average energy or current supplied through bit line 14 is, therefore, quite small.

Figure 2:
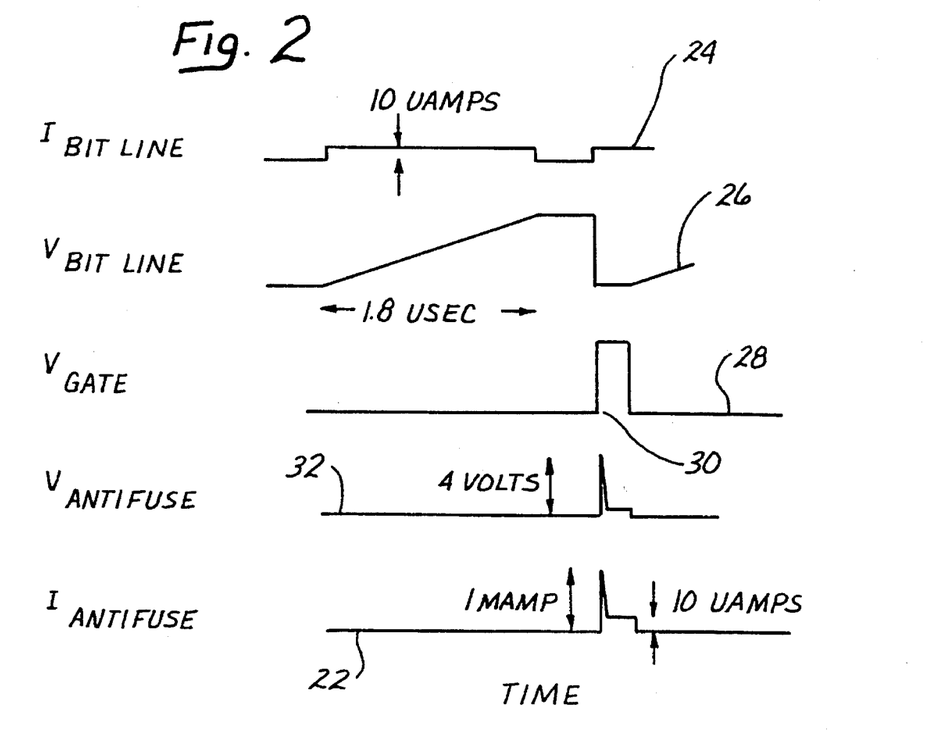
FIG. 2 is a timing diagram of the programming method of the invention used in the memory cell of FIG. 1.

Normally, the electrical behavior as shown in FIG. 2 would not be considered a benefit. However, in the situation of RFID tags, the amount of energy available to the integrated circuit within the RFID tag is very limited. Typically, the power supplied to an RFID tag is supplied remotely through radiofrequency transmission. The amount of power required to read an RFID tag is typically 20 microwatts, usually operating at the level 2 volts and 10 microamps. On the basis of the information described above concerning the power needed to program a bit, the power supply to an RFID tag would have to be increased to 60 microwatts, namely 6 volts at 10 microamps. If the memory device were based upon UV or electrically erasable memories, the power levels would need to be increased to 5,000 to 1,500 microwatts respectively. Even these higher numbers for other technologies are misleading since neither UV nor electrically erasable devices can be programmed with transient pulses, but require well defined sustained voltage pulses.

Self-Calibration of Timing for an RFID Tag

According to the invention, a reference signal is generated initially in the remote RFID tag receiver by capturing an incoming standard signal and placing it in temporary or permanent storage in the RFID tag circuit. Signals arriving later in time are then compared to the captured standard. Variations from the captured standard are then detected to allow for decoding of the data by either AM or FM techniques.

Figure 3:
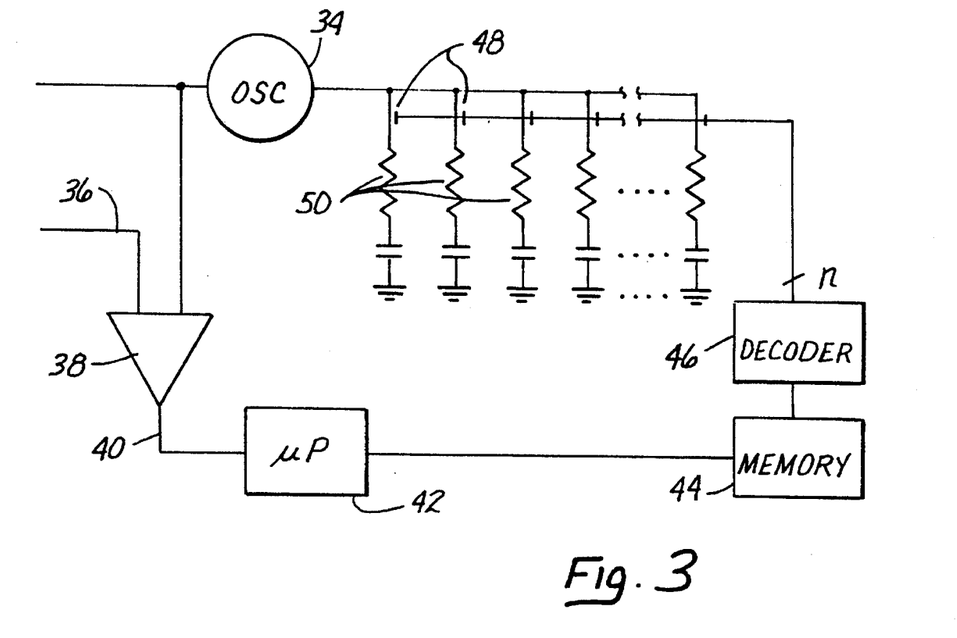
FIG. 3 is a schematic of a power of a self-calibrating circuit for an RFID tag.

FIG. 3 is a simplified block diagram illustrating one means of implementing the invention. An oscillator 34 on the RFID tag chip operates approximately at the carrier frequency of the input signal or some multiple thereof. As shown in FIG. 3, an input signal is provided on line 36 and an appropriate characteristic thereof, such as frequency, phase shift, time delay, or the like, is compared in a comparator circuit 38, which has as its other input, the output of oscillator 34. The difference in the characteristic parameter between the two is provided on output 40 of comparator 38 and appropriately converted if necessary to digital format by an analog-to-digital converter. A correction command signal is ultimately provided by means of a microprocessor 42 to a memory 44. Typically, because of the design of oscillator 34 it cannot perform accurately enough because of large variation components or processing of the integrated circuits or other environmental factors.

The correction signal corresponding to the difference signal is stored within memory 44 and then coupled through a decoder 46 to a plurality of switching devices 48, or a resistance ladder coupled to a single capacitance (not shown), each of which switches 48 are coupled to n RC circuits 50. Any device or network capable of selectively providing circuit options to oscillator 34 through which oscillator frequency may be varied can be equivalently substituted. Each RC circuit 50 corresponds to a different RC delay, which when coupled through one of the devices 48 to oscillator 34, serves to adjust the output of oscillator 34. The appropriate one or ones of RC delay circuits 50 are thus chosen by microprocessor 42 until the output of comparator 38 indicates that the appropriate difference signal between input signal on line 36 and that output by oscillator 34 falls within an acceptable range. When this achieved, the correction signal is stored within memory 48 for use during all subsequent operation of the RFID tag or at least until it is updated. Memory 44 may be provided as a nonvolatile memory to allow the calibration information to be stored permanently so that reconfiguration of the internal oscillator is not required each time the tag is powered up.

The operation can be clarified by considering an example. An initially selected resistor of 100 kiloohms and a capacitor of 50 picofarads results in a time constant of 5 microseconds for oscillator 34. Due to process variations, the final resistance might actually be instead 130 kiloohms resulting in an actual time constant of 6.5 microseconds, thereby putting oscillator 34 off frequency.

If an input signal had a periodicity of 4 microseconds, the time constant of the internal signal must be reduced in order to match the incoming signal in a one-to-one fashion. Therefore, the resistor coupled to the internal oscillator 34 must be trimmed back to 80 kiloohms in order for the RC time constant for the oscillator to equal 4 microseconds. Conventional resistor ladder networks allow such a transition within the accuracy required.

Figure 4:
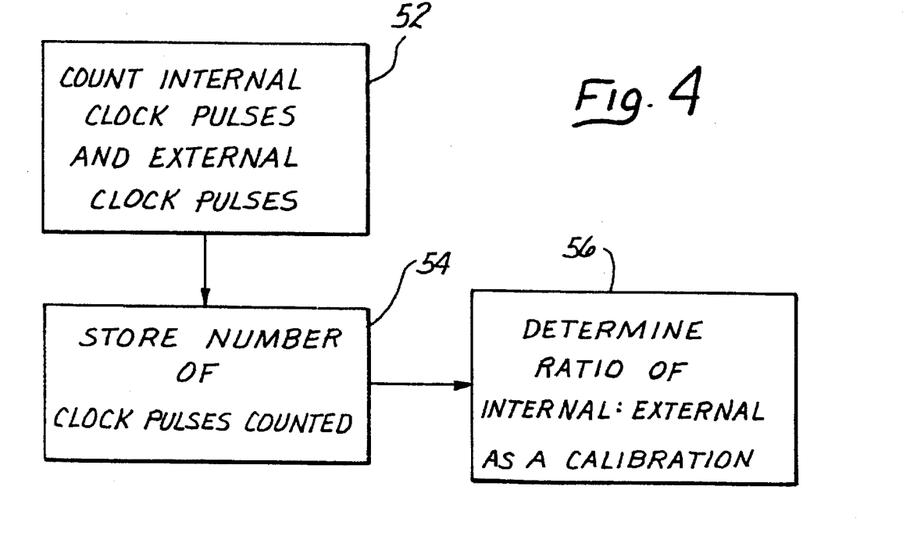
FIG. 4 is a flow diagram illustrating the operation of another embodiment of the invention where the circuit self-calibrates to a carrier signal.

An alternative methodology is summarized by the flow diagram of FIG. 4. The internal clock pulses from the RFID tag clock are counted at step 52 during a predetermined number of external clock pulses or at least during some arbitrary time period. The number internal clock pulses which were counted are then stored in step 54. The ratio of the number of internal-to-external clock pulses is determined at step 56. This ratio becomes a calibration standard. Thereafter deviations from this ratio can be recognized as meaningful data with no attempt made to actually calibrate the RFID tag clock to the external communication standard, but simply to measure and store what is in effect a recalibration ratio.

For example, assume data is transmitted through frequency shift keying between 915 Megahertz and 920 Megahertz. Assume the clock on the RFID tag chip is operating not at the 915 Megahertz standard, but at 914 Megahertz. The calibration ratio established by the methodology diagrammed in FIG. 4 of the internal clock frequency versus the input signal clock frequency is thus 0.9989. When a 920 Megahertz input signal is then received, the ratio changes to 0.9935. Therefore, high frequency changes in the ratio can be reliably identified as a data change of state. Slower variations for device drift, device aging and environmental drift can be detected and used to readjust the calibration ratio appropriately.

Figure 5:
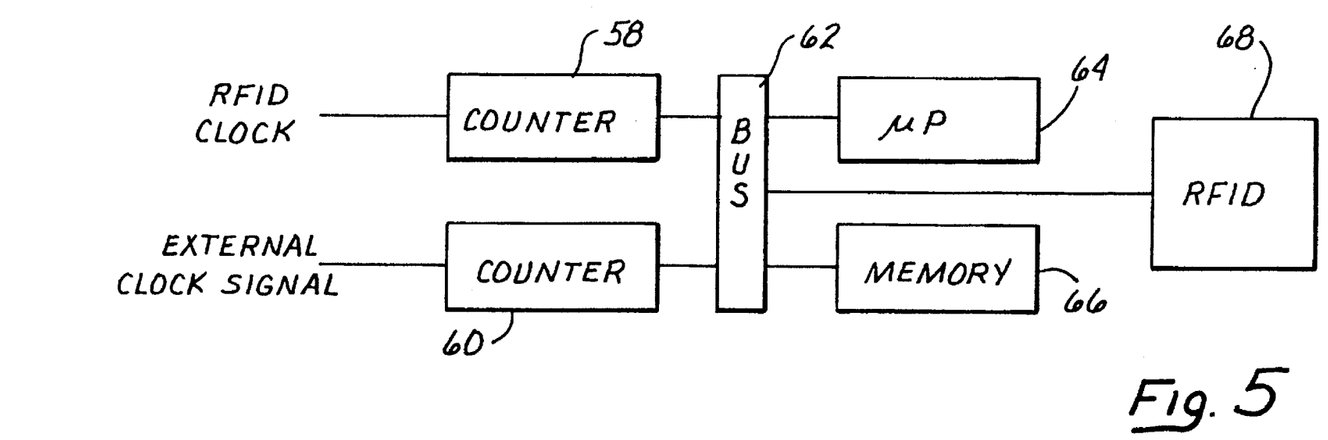
FIG. 5 is a block diagram of a circuit wherein the method of FIG. 4 is used.

FIG. 5 illustrates a block diagram of one circuit which may be used to implement the methodology of FIG. 4. The internal RFID tag clock is provided to a first counter 58, while the external input signal or external clock signal is provided to a second counter 60. Both counters 58 and 60 count the clock signals received during some predetermined time after which the accumulated count is provided to an address and data bus 62 to which a microprocessor 64 and memory 66 are coupled. The calculated and stored ratio is then used as a calibration device for the operation of the RFID tag circuitry symbolically denoted in FIG. 5 by reference numeral 68.

Bit and Frame Synchronization

The present invention overcomes the disadvantages of bit and frame synchronization described in the prior art section above, and lends itself to being implemented in an integrated circuit in a manner which does not contain a phase lock loop or necessarily even a microprocessor. In the invention, a unique bit pattern is provided which is a typical data pattern, rather than being a prohibited or even an atypical data pattern. Bit and frame synchronization is achieved by violation of an error management scheme such as an error c and correcting (ECC) scheme which utilizes parity or polynomial bits to achieve frame synchronization. At the same time, the use of a typical data pattern provides some assurance that the real data will be correctly recognized.

An example will make this clearer. In an even parity scheme, the unique pattern is an irregular pattern of 1's and 0's with an odd parity bit identifying it as the frame marker followed by data with even parity. Bit synchronization can, thus, be achieved anywhere in the bit stream. The unique frame marker pattern is efficiently matched to a stored pattern and validated by odd parity with the marking word and even parity with the following data words.

In other words, the broadcast digital information has embedded within it a combination of bits comprising a unique bit pattern. The unique bit pattern, may be a data pattern in which a particular error management scheme for the parity bit is chosen contrary to the assumed error convention. Whenever this unique pattern with a parity error is received, it is recognized as a synchronization frame for all the following data and is not treated as an error. The chance that the unique pattern with a parity error will occur is so small that incorrect identification in the unique synchronization frame is extremely improbable.

An example makes the approach clear. Assume that 32 bit words are being generated in which the last bit is a parity bit. Assume further that the error detection and correction scheme assumes even parity, that is the number of 1 bits in the 32 bit word are always transmitted so that an even number of bits are included in the word, the parity bit being 1 or 0 as appropriate to make this so. Now assume that 31 of the bits are data bits and that a unique pattern of these 31 bits are chosen as the frame synchronization pattern. Assume that this pattern has an even number of 1's in it. The parity bit would be 0, if the error correction scheme were not violated. In this case, the parity error is intentionally violated and the parity bit is set at 1. The communication system in the RFID tag will then recognize the word as having a parity error, but as also having the unique frame synchronization data pattern. Therefore, the parity error will be ignored. The time of receipt of this word is then taken as a synchronization or frame marker.

For an 8-bit word the chance of a data pattern assuming the unique data bit pattern and having a parity error is 1 out of $2^8$, or 256 to 1 assuming as a worse case that there is a 50% chance of a data error. In fact the data error rate in most systems is much lower, typically one out of $2^{32}$ after noting multiple replicate transmissions in most RFID tag applications. For an 8 bit word, this probability is probably not high enough for reliable synchronization. However, in a 32 bit word, the probability of this parity error and bit pattern occurring becomes $2^{32}$ in the very worst case, or becomes more than 4 billion to 1 against it. Communication error rates at this level are more than acceptable and are exceeded by other error factors which normally arise in an RFID tag application.

Figure 6:
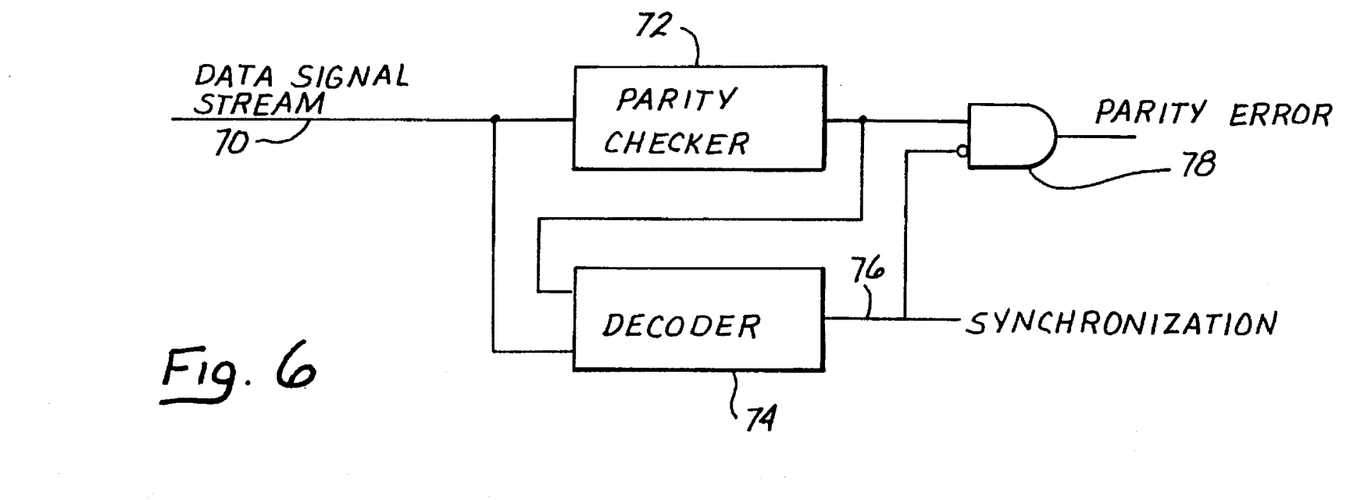
FIG. 6 is a block diagram of a circuit where a bit and frame synchronization of the invention is used.

The scheme can be easily implemented in an RFID tag device simply by using a special decoder in combination with a conventional parity checker to detect the unique data frame synchronization to disable the parity checker output for that word and to provide an internal synchronization control signal for use within the RFID tag circuit in response. FIG. 6 is a simplified block diagram of one circuit in which the synchronization protocol can be implemented. The input data stream is coupled on line 70 to a conventional parity checker 72 and to decoder 74 which checks the data stream for the unique bit pattern together with the parity violation. When this occurs, decoder 74 disables the output of parity checker 72 by means of gate 78 so that no parity error signal is transmitted to the RFID tag circuits (not shown), and generates a synchronization pulse on its output 76.

Simultaneous Power and Data Transmission

Figure 7:
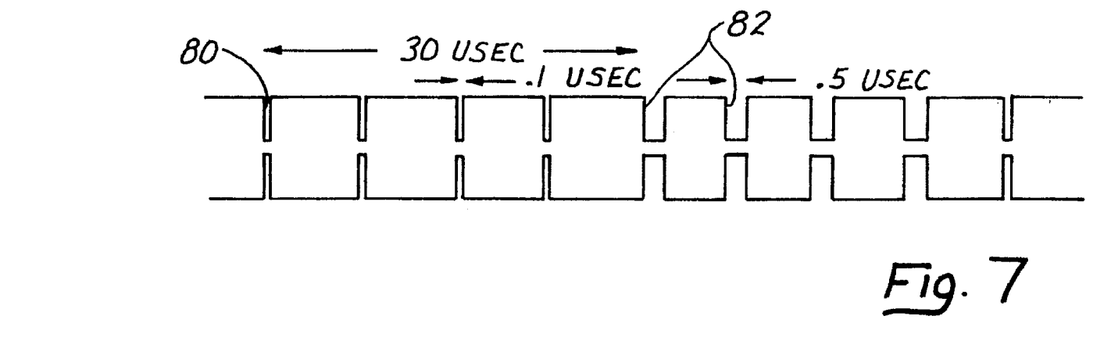
FIG. 7 is a wave diagram showing data transmission on a power carrier signal.

By operating at high frequencies the carrier frequency can be reduced in amplitude or turned off completely for short periods of time as diagrammatically depicted in FIG. 7 without causing the RFID tag to lose power. Since the reduction in carrier signal strength is for such a short period of time, the DC power in the integrated circuit within the tag after rectification does not undergo a significant reduction.

An example should make this clear. Consider a sample calculation in which the longest pulse duration that the carrier would be turned off is 0.5 microseconds. Assume that the DC current requirement is 20 microamps and the capacitance of the voltage supply line, Vdd, on the RFID tag is 200 picofarads. For this time period, it can be shown that the decrease in voltage on the Vdd line is approximately 0.05 volts. A 50 millivolt decrease in the power supply is typically not so drastic as to cause the chip to become inoperable.

The periodicity of modulation allows for simple clocking. In addition, varying the duration of the signal can be used to transmit data as 1's and 0's. FIG. 7 is a wave diagram of a carrier envelope, showing typical data which might be transmitted at a 33 kilohertz baud rate. The circuitry within the RFID tag only has to be able to distinguish between a 0.1 and a 0.5 microsecond pulse to be able to reliably identify whether a 1 or 0 is being transmitted. For example, the 0.1 microsecond pulse 80 may be used to represent 0's, while the 0.5 microsecond pulse 82 used to represent binary 1's. Error reduction can be accomplished through redundancy or pulse repetition.

The RFID tag remains fully powered because even though the carrier envelope is essentially turned off by the data transmissions, the pulse width is not so great as to cause the chip to power down at the baud rates that RFID tags normally operate. For example, as shown in FIG. 7, at 33 kilohertz baud rate, a pulse is transmitted only once each 7.5 microseconds. This leaves approximately a 98 percent duty cycle which allows the power circuitry within the RFID tag to easily recover the small voltage loss during the longest pulse duration 82 which it sees.

Figure 8:
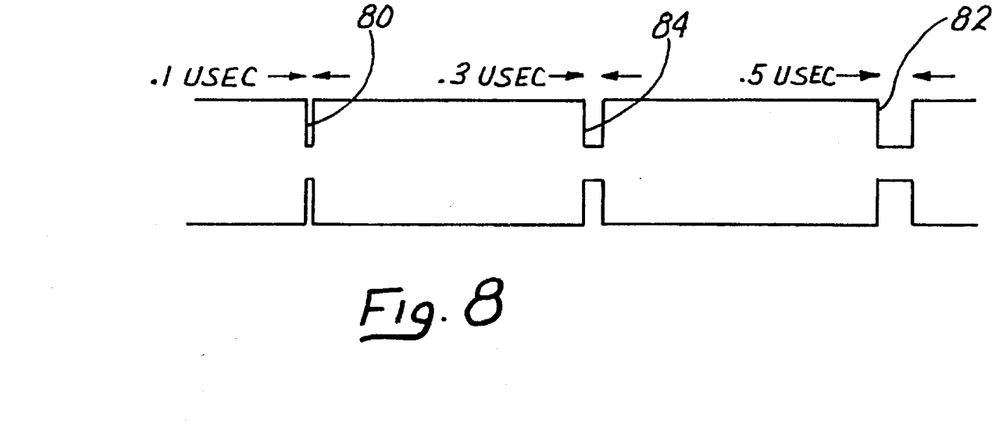
FIG. 8 is a wave diagram of an alternative embodiment showing data and control signal transmission on a power carrier signal.

An alternative scheme is illustrated in FIG. 8. Here, three different duration pulses are used to represent a marker, a binary 0 and a binary 1. Again, the 0.1 microsecond pulse 80 represents a binary 0, the 0.5 microsecond pulse 82 a binary 1, and the 0.3 microsecond pulse 84 a synchronization, control signal or other identifying marker. All that is required of the RFID tag circuitry is that it is capable of detecting pulse widths have a 0.2 microsecond difference.

A consequence of this technique is that the clocking of the chip on the RFID tag can be determined from the modulation of the carrier at a much lower rate than the actual carrier itself. This, in turn, saves significant energy consumption on the RFID tag because circuitry operating at high speeds consume substantially greater energy than those operating at lower speeds.

An RFID Tag Diode for Use in Power Rectification

Figure 11:
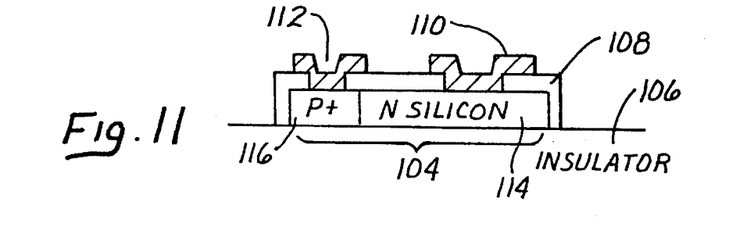
FIG. 11 is a cross-sectional view of a integrated circuit SOS diode for use in the bridge circuit of FIG. 9 in an RFID tag.

A diode rectifier is formed according to the invention by isolating the diodes from the integrated circuit substrate to insure that a charge is not inadvertently applied to the diode or other circuitry. One means of implementing this is to fabricate the diodes in an integrated circuit process with an inter-element isolation such as silicon on sapphire (SOS) such as shown in cross sectional view in FIG. 11, or more generally by fabrication by silicon on insulator. In either case, the active device such as diode 104 is completely surrounded by an insulator, namely the substrate insulator 106 and the encapsulating passivating insulator 108. Metallic contacts 110 and 112 are provided to the N-doped region 114 and P-doped region 116, respectively.

Figure 12:
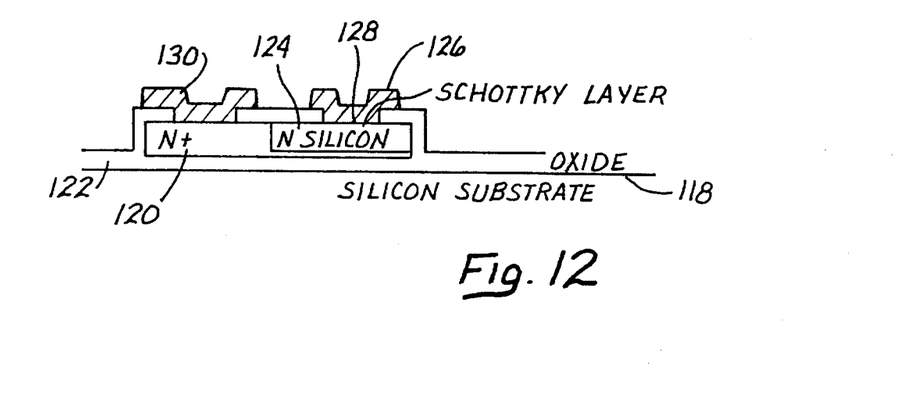
FIG. 12 is a cross-sectional view of a integrated circuit stacked diode for use in the bridge circuit of FIG. 9 in an RFID tag.

Another means of achieving the same result is to fabricate the diode within the rectifier bridge on top of an integrated circuit surface as depicted in FIG. 12. Fabrication on integrated circuit surfaces is shown in Roesner, "*Mass Programmable Read-Only Memory Stacked Above a Semiconductor Substrate*," U.S. Pat. No. 4,424,579 (1984), in which is stacked diode is used as a memory cell. In FIG. 2 the integrated circuit silicon substrate is provided beneath an oxide encapsulated N+ region 120. An oxide layer 122 lies between doped region 120 and substrate region 118. An N type silicon layer 124 is then nested within N+ region 120 and appropriately exposed to a metallic contact 26 to form a Schottky diode layer at the interface 128 therebetween. The heavily doped contact region 120 is similarly opened and provided with an electrical contact 130. The Schottky diode of FIG. 12 could equivalently be substituted with a P-N junction diode if desired. The Schottky diode is preferred because it is a majority carrier device and does not require as high a quality single crystal silicon as that required by a P-N junction. Additionally, the Schottky diode is much faster and can easily respond to a high frequency carrier signal which is atypical for the conventional integrated circuit diode bridge discussed above in connection with FIGS. 9 and 10.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result.

In addition to the equivalents of the claimed elements, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. A method of programming a radiofrequency identification device comprising:

providing an antifuse in a memory cell coupled to a bit line in said radiofrequency identification device;

charging a stray capacitance on said bit line; and selectively discharging said antifuse to draw a high peak current through said antifuse from said charged stray capacitance to program said antifuse, whereby said antifuse is programmed at high speed and low power.

2. The method of claim 1 where charging said stray capacitance comprises charging said capacitance to a voltage exceeding the antifuse programming voltage.

3. The method of claim 1 where charging said stray capacitance on said bit line charges said capacitance with approximately 60 microwatts of power or less.

4. The method of claim 1 where charging said stray capacitance on said bit line charges said capacitance with approximately less than 100 microwatts of power.

5. The method of claim 1 where selectively discharging said antifuse couples said antifuse through a gated transistor to ground, said gated transistor having a maximum saturation current capacity, said antifuse having a programming time defined for a predetermined time duration, said stray capacitance on said bit line being charged to a power level such that said saturation current is achieved through said antifuse and transistor during said programming time of said antifuse.

6. A method of programming an antifuse having a minimum programming time at high speed and low power comprising:

charging a bit line coupled to said antifuse to a predetermined voltage and thus stored predetermined power level, said bit line having a chargeable capacitance; and discharging said bit line through said antifuse at high speed substantially equal to said minimum programming time required by said antifuse to generate a voltage and current spike through said antifuse sufficient to program said antifuse while utilizing low average power.

* * * * *